United States Patent
Jiang et al.

(10) Patent No.: US 10,957,533 B2
(45) Date of Patent: Mar. 23, 2021

(54) METHODS FOR ETCHING A STRUCTURE FOR SEMICONDUCTOR APPLICATIONS

(71) Applicant: Applied Materials, Inc., Santa Clara, CA (US)

(72) Inventors: Hao Jiang, San Jose, CA (US); He Ren, San Jose, CA (US); Hao Chen, Santa Clara, CA (US); Mehul B. Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/656,018

(22) Filed: Oct. 17, 2019

(65) Prior Publication Data

US 2020/0135459 A1 Apr. 30, 2020

Related U.S. Application Data

(60) Provisional application No. 62/752,764, filed on Oct. 30, 2018.

(51) Int. Cl.
*H01L 21/02* (2006.01)
*H01L 21/30* (2006.01)
(Continued)

(52) U.S. Cl.
CPC .. *H01L 21/02337* (2013.01); *H01L 21/02491* (2013.01); *H01L 21/3003* (2013.01);
(Continued)

(58) Field of Classification Search
CPC ............... H01J 37/00; H01J 37/32449; H01L 21/02071; H01L 21/02337;
(Continued)

(56) References Cited

U.S. PATENT DOCUMENTS

| 4,524,587 A | 6/1985 | Kantor |
| 4,879,259 A | 11/1989 | Reynolds et al. |

(Continued)

FOREIGN PATENT DOCUMENTS

| CN | 101871043 A | 10/2010 |
| CN | 104047676 A | 9/2014 |

(Continued)

OTHER PUBLICATIONS

Office Action for Japanese Appiication No. 2018-546484 dated Oct. 8, 2019.

(Continued)

*Primary Examiner* — Lan Vinh
(74) *Attorney, Agent, or Firm* — Patterson + Sheridan, LLP

(57) ABSTRACT

Embodiments of the present disclosure provide methods and apparatus for forming and patterning features in a film stack disposed on a substrate. In one embodiment, a method for patterning a conductive layer on a substrate includes supplying a gas mixture comprising a chlorine containing gas at a first flow rate to etch a first conductive layer disposed on the substrate, lowing the chlorine containing gas in the first gas mixture to a second flow rate lower than the first flow rate to continue etching the first conductive layer, and increasing the chlorine containing gas in the first gas mixture to a third flow rate greater than the second flow rate to remove the first conductive layer from the substrate.

20 Claims, 10 Drawing Sheets

(51) Int. Cl.
*H01L 21/477* (2006.01)
*H01L 21/3213* (2006.01)
*H01L 21/67* (2006.01)

(52) U.S. Cl.
CPC ...... *H01L 21/32135* (2013.01); *H01L 21/477* (2013.01); *H01L 21/67253* (2013.01)

(58) Field of Classification Search
CPC ........... H01L 21/02491; H01L 21/3003; H01L 21/31138; H01L 21/32135; H01L 21/32136; H01L 21/32138; H01L 21/477; H01L 21/67017; H01L 21/67103; H01L 21/6719; H01L 21/67248; H01L 21/67253
USPC ............... 438/700, 712, 714, 719, 720, 736; 216/67, 76, 77
See application file for complete search history.

(56) References Cited

U.S. PATENT DOCUMENTS

| | | |
|---|---|---|
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,175,123 A | 12/1992 | Vasquez et al. |
| 5,319,212 A | 6/1994 | Tokoro |
| 5,366,905 A | 11/1994 | Mukai |
| 5,578,132 A | 11/1996 | Yamaga et al. |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,468,490 B1 | 10/2002 | Shamouilian et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,084,079 B2 | 8/2006 | Conti et al. |
| 7,111,630 B2 | 9/2006 | Mizobata et al. |
| 7,114,517 B2 | 10/2006 | Sund et al. |
| 7,211,525 B1 | 5/2007 | Shanker et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Li et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,685,266 B2* | 4/2014 | Parker ...................... C23F 4/00 216/67 |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 10,096,516 B1 | 10/2018 | Leschkies et al. |
| 10,276,411 B2 | 4/2019 | Delmas et al. |
| 2001/0029108 A1 | 10/2001 | Tometsuka |
| 2001/0034106 A1* | 10/2001 | Moise ............... H01L 21/32139 438/396 |
| 2001/0041122 A1 | 11/2001 | Kroeker |
| 2001/0050096 A1 | 12/2001 | Costantini et al. |
| 2002/0066535 A1 | 6/2002 | Brown et al. |
| 2002/0073922 A1 | 6/2002 | Frankel et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2003/0030945 A1 | 2/2003 | Heinonen et al. |
| 2003/0049372 A1 | 3/2003 | Cook et al. |
| 2003/0101938 A1 | 6/2003 | Ronsse et al. |
| 2003/0148035 A1 | 8/2003 | Lingampalli |
| 2003/0148631 A1 | 8/2003 | Kuo et al. |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0105107 A1 | 5/2006 | Lindeboom et al. |
| 2006/0124613 A1 | 6/2006 | Kumar et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0083109 A1 | 4/2008 | Shibata et al. |
| 2008/0115726 A1 | 5/2008 | Ingle et al. |
| 2008/0121882 A1 | 5/2008 | Hwang et al. |
| 2008/0210273 A1 | 9/2008 | Joe |
| 2008/0251904 A1 | 10/2008 | Theuss et al. |

(56) References Cited

U.S. PATENT DOCUMENTS

| | | |
|---|---|---|
| 2009/0018688 A1 | 1/2009 | Chandler et al. |
| 2009/0081884 A1 | 3/2009 | Yokota et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2011/0215380 A1* | 9/2011 | Lahreche .......... H01L 29/66462 257/194 |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0206764 A1* | 7/2015 | Wang ................ H01L 21/31122 438/710 |
| 2015/0255581 A1 | 9/2015 | Lin et al. |
| 2015/0270140 A1* | 9/2015 | Gupta ............... H01L 21/32136 216/67 |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0314964 A1 | 10/2016 | Tang et al. |
| 2016/0334162 A1 | 11/2016 | Kim et al. |
| 2016/0336405 A1 | 11/2016 | Sun et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0084487 A1 | 3/2017 | Chebiam et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0261480 A1 | 9/2018 | Liang et al. |
| 2018/0286674 A1 | 10/2018 | Manna et al. |
| 2018/0315626 A1 | 11/2018 | Franklin |
| 2018/0337027 A1 | 11/2018 | L'Heureux et al. |
| 2018/0342384 A1 | 11/2018 | Wong et al. |
| 2018/0350563 A1 | 12/2018 | Manna et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0228982 A1 | 7/2019 | Chen et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0279879 A1 | 9/2019 | Singh et al. |
| 2019/0311896 A1 | 10/2019 | Balseanu et al. |
| 2019/0368035 A1 | 12/2019 | Malik et al. |
| 2020/0035509 A1 | 1/2020 | Khan et al. |
| 2020/0035513 A1 | 1/2020 | Khan et al. |
| 2020/0098574 A1 | 3/2020 | Wong et al. |

FOREIGN PATENT DOCUMENTS

| | | |
|---|---|---|
| CN | 104089491 A | 10/2014 |
| JP | 63-004616 | 1/1988 |
| JP | 06-283496 | 10/1994 |
| JP | H0748489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008073611 A | 4/2008 |
| JP | 2009-129927 A | 6/2009 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20030052162 A | 6/2003 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |

(56) References Cited

FOREIGN PATENT DOCUMENTS

| WO | 2005057663 A2 | 6/2005 |
| WO | 2008/089178 A2 | 7/2008 |
| WO | 2011/103062 A2 | 8/2011 |
| WO | 2012/133583 A1 | 10/2012 |
| WO | 2016/018593 A1 | 2/2016 |
| WO | 2016065219 A1 | 4/2016 |

OTHER PUBLICATIONS

International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Appiicatien No. 108111501 dated Nov. 14, 2019.
Taiwan Office Action dated Jun. 11, 2019 for Application No. 107138905.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136151.
International Search Report and Written Opinion for International Application No. PCT/US2019/029602 dated Aug. 14, 2019.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
International Search Report and Written Opinion for PCT/US2018/050464 dated Jan. 4, 2019.
International Search Report and Written Opinion for PCT/US2019/056447 dated Feb. 7, 2020.

\* cited by examiner

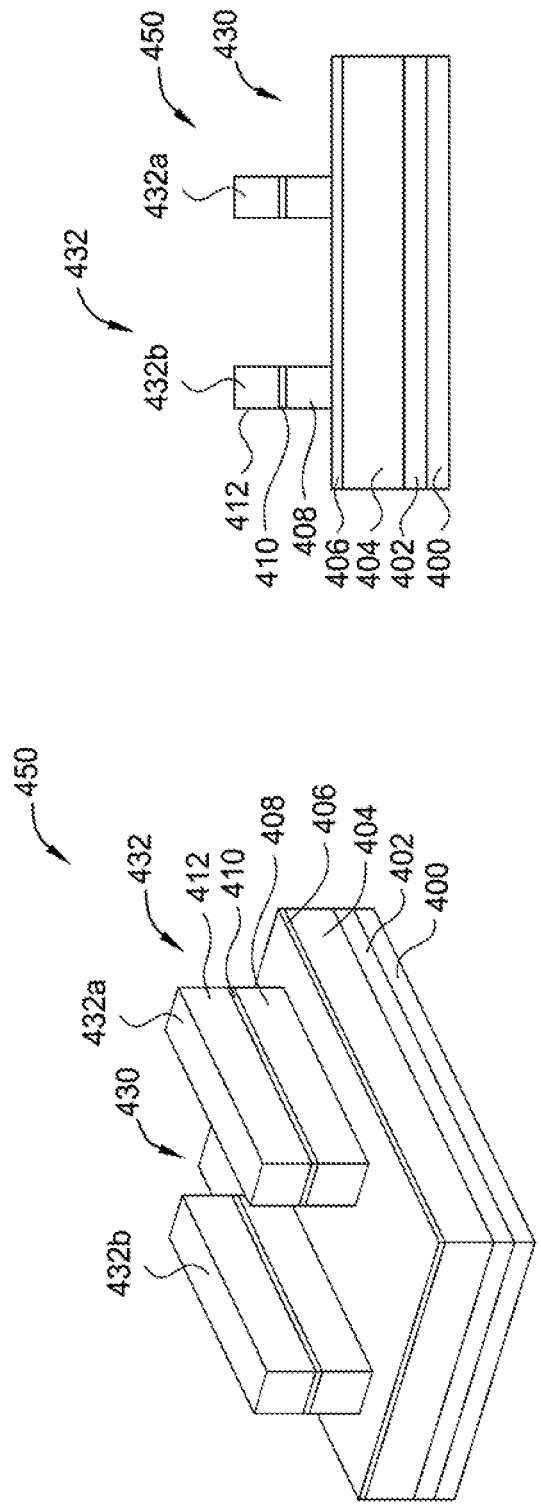

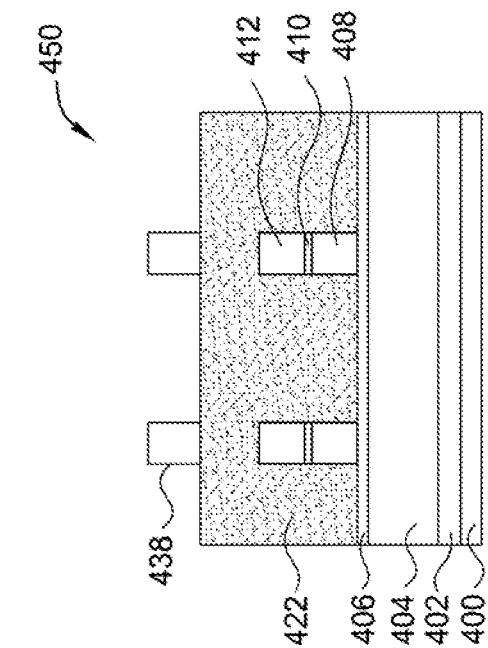
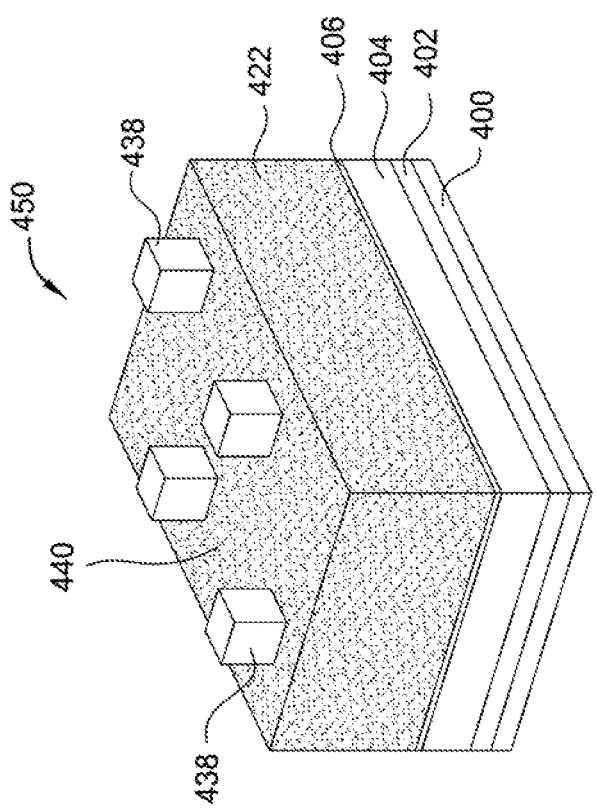

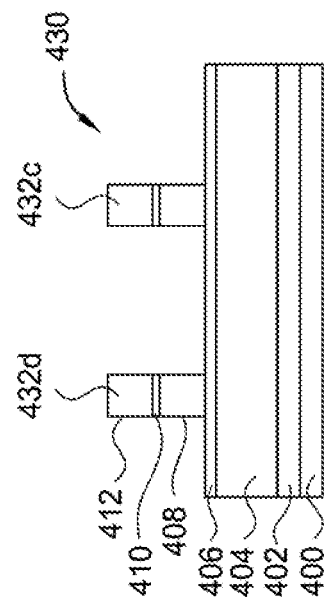
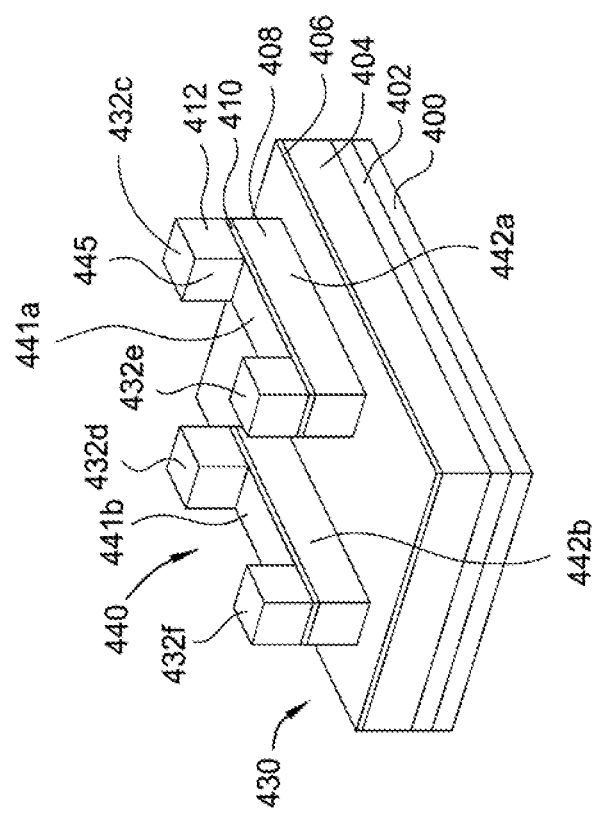

METHODS FOR ETCHING A STRUCTURE FOR SEMICONDUCTOR APPLICATIONS

CROSS-REFERENCE TO RELATED APPLICATIONS

This application claims benefit of U.S. Provisional Application Ser. No. 62/752,764 filed Oct. 30, 2018, which is incorporated by reference in its entirety.

BACKGROUND

Field

Examples of the present disclosure generally relate to deposition and etching process for forming structure in a film stack. Particularly, embodiments of the present disclosure provide methods for a multiple etching process for forming features in a film stack with different materials in semiconductor applications.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 100 masks is used to construct a chip and can be used repeatedly.

With the shrinking of critical dimensions (CD), present optical lithography is approaching a technological limit at the 45 nanometer (nm) technology node. Next generation lithography (NGL) is expected to replace the conventional optical lithography method, for example, in the 20 nm technology node and beyond. The images of the patterned mask are projected through the high-precision optical system onto the substrate surface, which is coated with a layer of photoresist. The patterns are then formed on the substrate surface after complex chemical reactions and follow-on manufacturing steps, such as development, post-exposure bake and wet or dry etching.

Multiple deposition and etching process has been widely used to form structures with different materials on a substrate to enhance the feature density and accuracy. However, as the electrical performance requirement keeps pushing to the limit, different materials with different properties are often used in a structure to meet the performance requirement. However, high etching selectivity between different materials is often hard to achieve. Poor etching selectivity often result in deformed profiles, height loss or other defects resulted from the etching processes. Such deformation of the profiles has significantly impacted the critical dimension (CD) control and feature transfer to the target materials in the device structures. As a result, undesired structure profiles and inaccurate resultant dimensions render early failure of the device performance.

Therefore, there is a need for an apparatus and methods for performing an etching process with high selectivity between different materials in a film stack to form a structure on a substrate.

SUMMARY

Embodiments of the present disclosure provide methods and apparatus for etching a structure having different materials for semiconductor applications. In one embodiment, a method for patterning a conductive layer on a substrate includes supplying a gas mixture comprising a chlorine containing gas at a first flow rate to etch a first conductive layer disposed on the substrate, lowing the chlorine containing gas in the first gas mixture to a second flow rate lower than the first flow rate to continue etching the first conductive layer, and increasing the chlorine containing gas in the first gas mixture to a third flow rate greater than the second flow rate to remove the first conductive layer from the substrate.

In another embodiment, a method for patterning a conductive layer on a substrate includes performing a hydrogen treatment process on a substrate to remove residuals on the substrate, performing an etching process by supplying an etching gas mixture comprising chlorine containing gas to etch a first conductive layer on the substrate until a second conductive layer is exposed on the substrate, and performing a post annealing process at a process pressure between about 5 bar and 100 bar.

In yet another embodiment, a method for patterning a conductive layer on a substrate includes removing residuals from on a substrate by a hydrogen treatment process, wherein the residuals comprises organic material, wherein the substrate comprises having a first conductive layer disposed on a second conductive layer, etching the first conductive layer by supplying an etching gas mixture comprising chlorine containing gas until a second conductive layer is exposed on the substrate, wherein the chlorine containing gas in the etching gas mixture is maintained from a first flow rate to a second flow rate and further to a third flow rate while etching the first conductive layer, and performing a post annealing process at a process pressure between about 5 bar and 100 bar to thermally treat the second conductive layer on the substrate.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

FIGS. 4A-4B, 5A-5B, 6A-6B, 7A-7B, 8A-8B, 9A-9B and 10A-10B illustrate perspective and cross sectional views of a structure formed on a substrate during the etching process of FIG. 3.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for patterning features and manufacturing nanostructures with desired small dimensions in a film stack are provided. The methods utilize an etching process with high etching selectivity to etching certain materials in the film stack without substantially damaging other materials in the film stack. In one example, the etching process includes several procedures or steps. For example, a three step process including a residual removal process, a main etching process and a post annealing process is performed to etch a conductive layer in the film stack. Furthermore, the main etching process further includes a breaking-through process, a bulk etching process, and a residual clean process. These multiple processes can efficiently etch a target material, such as a conductive layer, in the film stack without substantially attacking other materials in the film stack.

The term "substrate" as used herein refers to a layer of material that serves as a basis for subsequent processing operations and includes a surface to be cleaned. For example, the substrate can include one or more material containing silicon containing materials, group IV or group III-V containing compounds, such as Si, polysilicon, amorphous silicon, silicon nitride, silicon oxynitride, silicon oxide, Ge, SiGe, GaAs, InP, InAs, GaAs, GaP, InGaAs, InGaAsP, GaSb, InSb and the like, or combinations thereof. Furthermore, the substrate can also include dielectric materials such as silicon dioxide, organosilicates, and carbon doped silicon oxides. The substrate may also include one or more conductive metals, such as nickel, titanium, platinum, molybdenum, rhenium, osmium, chromium, iron, aluminum, copper, tungsten, or combinations thereof. Further, the substrate can include any other materials such as metal nitrides, metal oxides and metal alloys, depending on the application. In one or more embodiments, the substrate can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

Moreover, the substrate is not limited to any particular size or shape. The substrate can be a round wafer having a 200 mm diameter, a 300 mm diameter, a 450 mm diameter or other diameters. The substrate can also be any polygonal, square, rectangular, curved or otherwise non-circular workpiece, such as a polygonal glass, plastic substrate used in the fabrication of flat panel displays.

Figure 1:
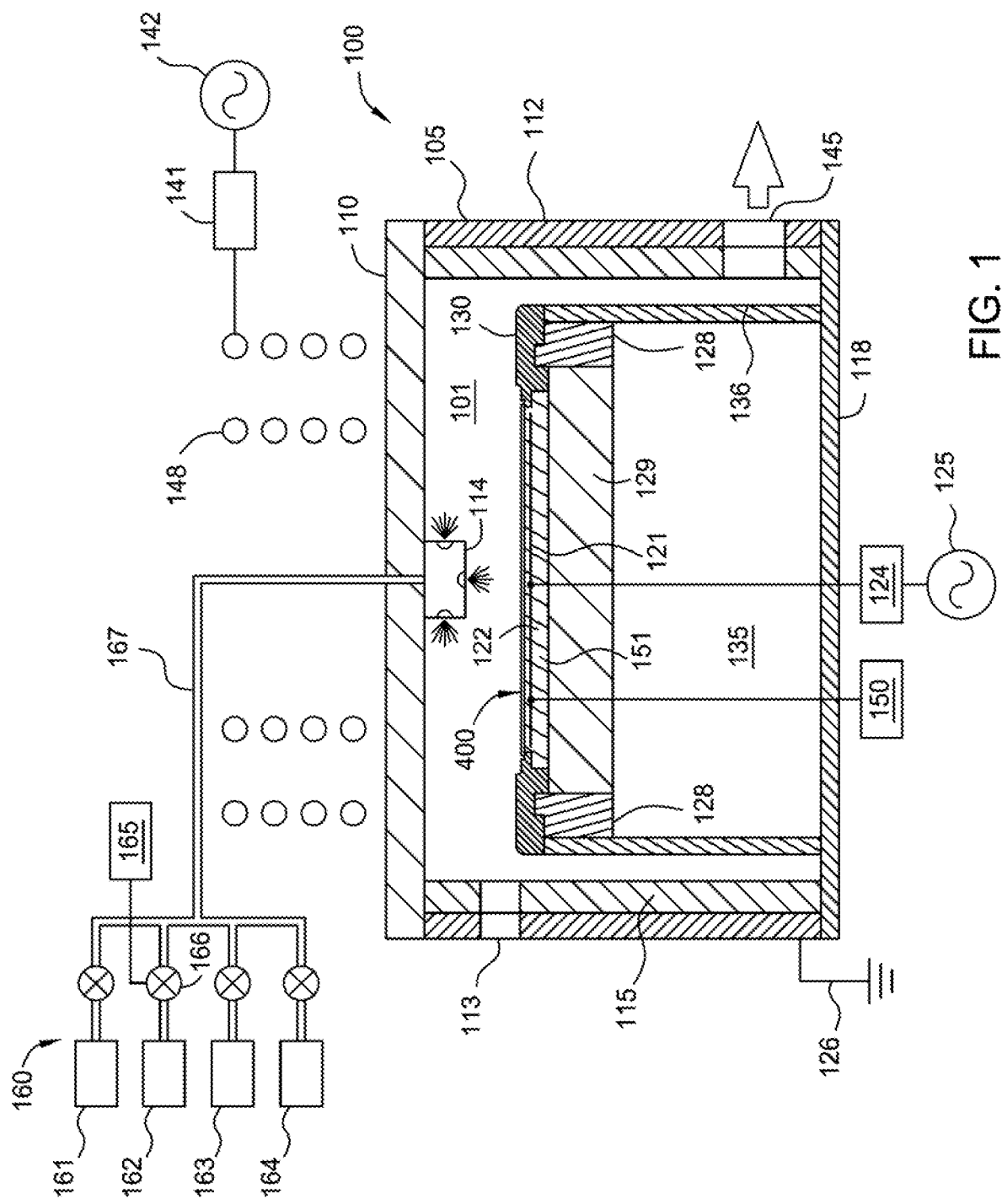
FIG. 1 is a schematic cross-sectional view of a processing chamber configured to perform an etching process according to one or more embodiments of the disclosure.

FIG. 1 is a simplified cutaway view for an exemplary processing chamber 100 suitable for etching a material layer disposed on a substrate 400 in the processing chamber 100. The exemplary processing chamber 100 is suitable for performing a patterning process. One example of the processing chamber 100 that may be adapted to benefit from the disclosure is an MESA® etching processing chamber, available from Applied Materials, Inc., located in Santa Clara, Calif. It is contemplated that other process chambers, including those from other manufactures, may be adapted to practice embodiments of the disclosure.

The plasma processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and generally are proportionally larger than the size of the substrate 400 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 400 into and out of the plasma processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), silicon chloride ($SiCl_4$), carbon tetrafluoride ($CF_4$), hydrogen bromide (HBr), hydrocarbon containing gas, argon gas (Ar), chlorine ($Cl_2$), nitrogen ($N_2$), helium (He) and oxygen gas ($O_2$). Additionally, process gasses may include nitrogen, chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$ and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the plasma processing chamber 100, the gases are energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 400 and/or above the substrate 400 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 is disposed in the chamber volume 101 to support the substrate 400 during processing. The substrate support pedestal 135 may include an electrostatic chuck 122 for holding the substrate 400 during processing. The electrostatic chuck (ESC) 122 uses the electrostatic attraction to hold the substrate 400 to the substrate support pedestal 135. The ESC 122 is powered by an RF power supply 125 integrated with a match circuit 124. The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 400 positioned thereon. The RF power supply 125 may cycle on and off, or pulse, during processing of the substrate 400. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 400.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 400 disposed thereon. The ESC 122 is configured to perform in the temperature range required by the thermal budget of the device being fabricated on the substrate 400. For example, the ESC 122 may be configured to maintain the substrate 400 at a temperature of about minus about 25 degrees Celsius to about 500 degrees Celsius for certain embodiments.

The cooling base 129 is provided to assist in controlling the temperature of the substrate 400. To mitigate process drift and time, the temperature of the substrate 400 may be maintained substantially constant by the cooling base 129 throughout the time the substrate 400 is in the cleaning chamber. In one embodiment, the temperature of the substrate 400 is maintained throughout subsequent cleaning processes at about 30 to 120 degrees Celsius.

A cover ring 130 is disposed on the ESC 122 and along the periphery of the substrate support pedestal 135. The cover ring 130 is configured to confine etching gases to a desired portion of the exposed top surface of the substrate 400, while shielding the top surface of the substrate support pedestal 135 from the plasma environment inside the plasma processing chamber 100. Lift pins (not shown) are selectively moved through the substrate support pedestal 135 to lift the substrate 400 above the substrate support pedestal 135 to facilitate access to the substrate 400 by a transfer robot (not shown) or other suitable transfer mechanism.

The controller 165 may be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

Figure 2:
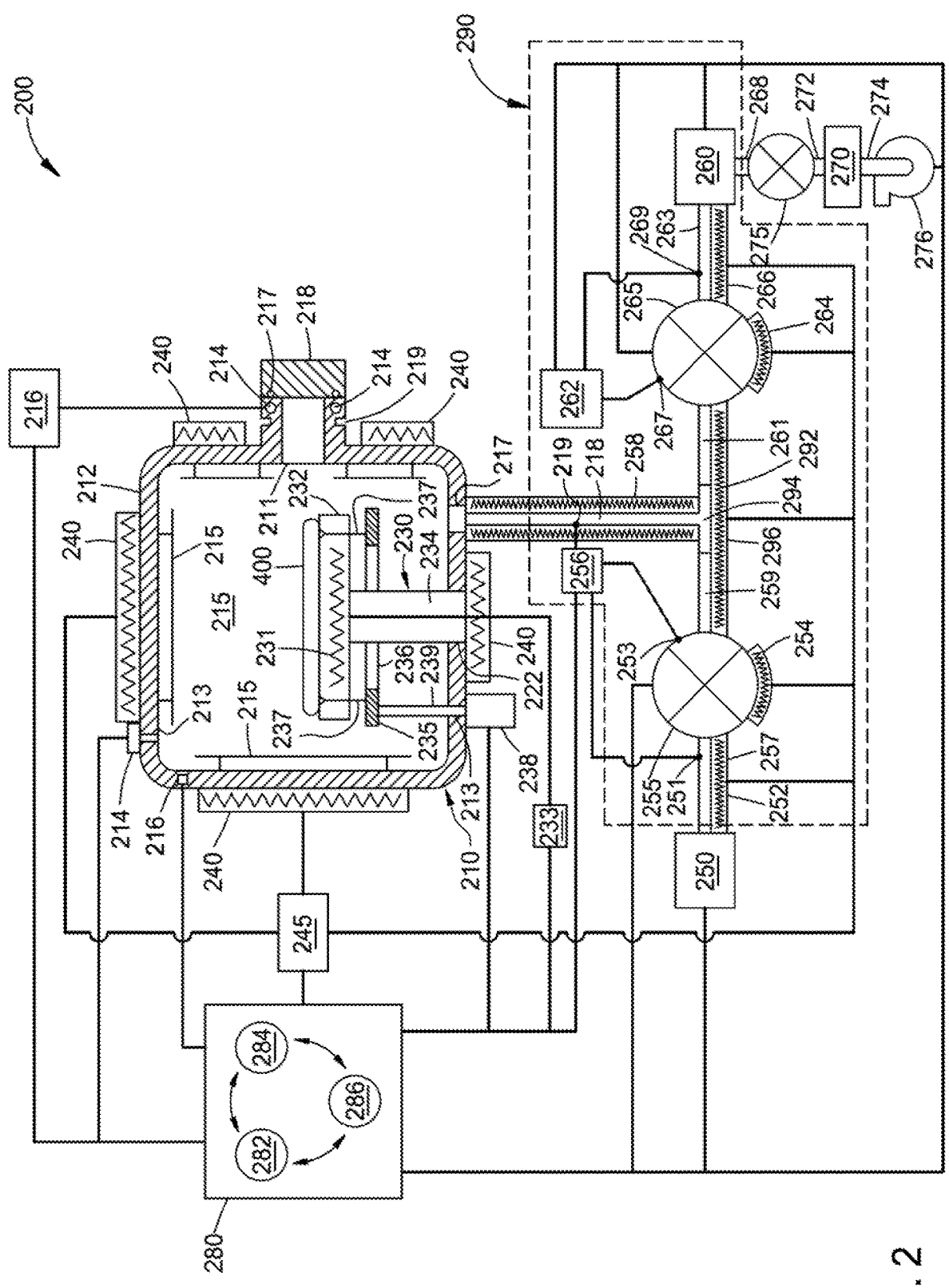
FIG. 2 is a simplified front cross-sectional view of a processing chamber in accordance with some embodiments.

FIG. 2 is a simplified front cross-sectional view of a single-substrate processing chamber 200 for a high-pressure annealing process of a single substrate 400. The single-substrate processing chamber 200 has a body 210 with an outer surface 212 and an inner surface 213 that encloses an internal volume 215. In some embodiments such as in FIG. 2, the body 210 has an annular cross section, though in other embodiments, the cross-section of the body 210 may be rectangular or any closed shape. The outer surface 212 of the body 210 may be made from a corrosion resistant steel (CRS), such as but not limited to stainless steel. One or more heat shields 225 are disposed on the inner surface 213 of the body 210 that prevents heat loss from the single-substrate processing chamber 200 into the outside environment. The inner surface 213 of the body 210 as well as the heat shields 225 may be made from nickel-based steel alloys that exhibit high resistance to corrosion, such as but not limited to HASTELLOY®, ICONEL®, and MONEL®.

A substrate support 230 is disposed within the internal volume 215. The substrate support 230 has a stem 234 and a substrate-supporting member 232 held by the stem 234. The stem 234 passes through a passage 222 formed through the chamber body 210. A rod 239 connected to an actuator 238 passes through a second passage 223 formed through the chamber body 210. The rod 239 is coupled to a plate 235 having an aperture 236 accommodating the stem 234 of the substrate support 230. Lift pins 237 are connected to the substrate-supporting member 232. The actuator 238 actuates the rod 239 such that the plate 235 is moved up or down to connect and disconnect with the lift pins 237. As the lift pins 237 are raised or lowered, the substrate-supporting member 232 is raised or lowered within the internal volume 215 of the chamber 200. The substrate-supporting member 232 has a resistive heating element 231 embedded centrally within. A power source 233 is configured to electrically power the resistive heating element 231. The operation of the power source 233 as well as the actuator 238 is controlled by a controller 280.

The single-substrate processing chamber 200 has an opening 211 on the body 210 through which one or more substrates 400 can be loaded and unloaded to and from the substrate support 230 disposed in the internal volume 215. The opening 211 forms a tunnel 221 on the body 210. A slit valve 228 is configured to sealably close the tunnel 221 such that the opening 211 and the internal volume 215 can only be accessed when the slit valve 228 is open. A high-pressure seal 227 is utilized to seal the slit valve 228 to the body 210 in order to seal the internal volume 215 for processing. The high-pressure seal 227 may be made from a polymer, for example a fluoropolymer, such as but not limited to a perfluoroelastomer and polytetrafluoroethylene (PTFE). The high-pressure seal 227 may further include a spring member for biasing the seal to improve seal performance. A cooling channel 224 is disposed on the tunnel 221 adjacent to the high-pressure seals 227 in order to maintain the high-pressure seals 227 below the maximum safe-operating temperature of the high-pressure seals 227 during processing. A cooling agent from a cooling fluid source 226, such as but not limited to an inert, dielectric, and high-performance heat transfer fluid, may be circulated within the cooling channel 224. The flow of the cooling agent from the cooling fluid source 226 is controlled by the controller 280 through feedback received from a temperature sensor 216 or a flow sensor (not shown). An annular-shaped thermal choke 229 is formed around the tunnel 221 to prevent the flow of heat from the internal volume 215 through the opening 211 when the slit valve 228 is open.

The single-substrate processing chamber 200 has a port 217 through the body 210, which is fluidly connected to a fluid circuit 290 connecting the gas panel 250, the condenser 260 and the port 217. The fluid circuit 290 has a gas conduit 292, a source conduit 257, an inlet isolation valve 255, an exhaust conduit 263, and an outlet isolation valve 265. A number of heaters 296, 258, 252, 254, 264, 266 are interfaced with different portions of the fluid circuit 290. A number of temperature sensors 251, 253, 219, 267 and 269 are also placed at different portions of the fluid circuit 290 to take temperature measurements and send the information to the controller 280. The controller 280 uses the temperature measurement information to control the operation of the heaters 252, 254, 258, 296, 264, and 266 such that the temperature of the fluid circuit 290 is maintained at a temperature above the condensation point of the processing fluid disposed in the fluid circuit 290 and the internal volume 215.

The gas panel 250 is configured to provide a processing fluid under pressure the internal volume 215. The pressure of the processing fluid introduced into the internal volume 215 is monitored by a pressure sensor 214 coupled to the body 210. The condenser 260 is fluidly coupled to a cooling fluid source (not shown) and configured to condense the gas phase processing fluid exiting the internal volume 215 through the gas conduit 292. The condensed processing fluid is then removed by the pump 276. One or more heaters 240 are disposed on the body 210 and configured to heat the internal volume 215 within the single-substrate processing chamber 200. The heaters 240, 252, 254, 258, 296, 264, and 266 maintain the processing fluid within the fluid circuit 290 in a gaseous phase while the outlet isolation valve 265 to the condenser 260 is open to prevent condensation within the fluid circuit.

The controller 280 controls the operation of the single-substrate processing chamber 200. The controller 280 controls the operation of the gas panel 250, the condenser 260, the pump 270, the inlet isolation valve 255, the outlet isolation valve 265, and the power sources 233 and 245. The controller 280 is also communicatively connected to the temperature sensor 216, the pressure sensor 214, the actuator 238, the cooling fluid source 226 and the temperature reading devices 256 and 262.

The processing fluid may comprise an oxygen-containing and/or nitrogen-containing gas, and/or chalcogen or tellurium (such as S, Se, Te) gases or vapors such as oxygen, dry steam, water, hydrogen peroxide, ammonia, S vapor, Se vapor, $H_2S$, $H_2Se$, etc. The processing fluid may be reacted with the metal materials on the substrate to form metal oxynitrides, metal oxides, metal oxychalcogenides or metal chalcogenides. Alternatively or in addition to the oxygen-containing and/or nitrogen-containing gases, the processing fluid may comprise a silicon-containing gas. Examples of the silicon-containing gas include organosilicon, tetraalkyl orthosilicate gases and disiloxane. Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more gases may be (dimethylsilyl)(trimethylsilyl)methane $((Me)_3SiCH_2SiH(Me)_2)$, hexamethyldisilane $((Me)_3SiSi(Me)_3)$, trimethylsilane $((Me)_3SiH)$, trimethylsilylchloride $((Me)_3SiCl)$, tetramethylsilane $((Me)_4Si)$, tetraethoxysilane $((EtO)_4Si)$, tetramethoxysilane $((MeO)_4Si)$, tetrakis-(trimethylsilyl)silane $((Me_3Si)_4Si)$, (dimethylamino)dimethyl-silane $((Me_2N)SiHMe_2)$ dimethyldiethoxysilane $((EtO)_2Si(Me)_2)$, dimethyl-dimethoxysilane $((MeO)_2Si(Me)_2)$, methyltrimethoxysilane $((MeO)_3Si(Me))$, dimethoxytetramethyldisiloxane $(((Me)_2Si(OMe))_2O)$, tris(dimethylamino)silane $((Me_2N)_3SiH)$, bis(dimethylamino)methylsilane $((Me_2N)_2CH_3SiH)$, disiloxane $((SiH_3)_2O)$, and combinations thereof.

During processing of the substrate 400, an environment of the internal volume 215 is maintained at a temperature and pressure that maintains the processing fluid within the high-pressure region in a vapor phase. Such pressure and temperature is selected based on the composition of the processing fluid. In the case of steam, the temperature and pressure is held at a condition that maintains the steam in a dry steam state. In one example, internal volume 215 is pressurized to a pressure greater than atmosphere, for example greater than about 2 bars. In another example, internal volume 215 is pressurized to a pressure from between about 10 and about 50 bars, such as from between about 20 and about 50 bars. In another example, the internal volume 215 is pressurized to a pressure up to about 100 bars. During processing, the internal volume 215 is also maintained at a high temperature, for example, a temperature exceeding 225 degrees Celsius (limited by the thermal budget of the substrates 400 disposed on the substrate-supporting member 132), such as between about 300 degrees Celsius and about 500 degrees.

Figure 3:
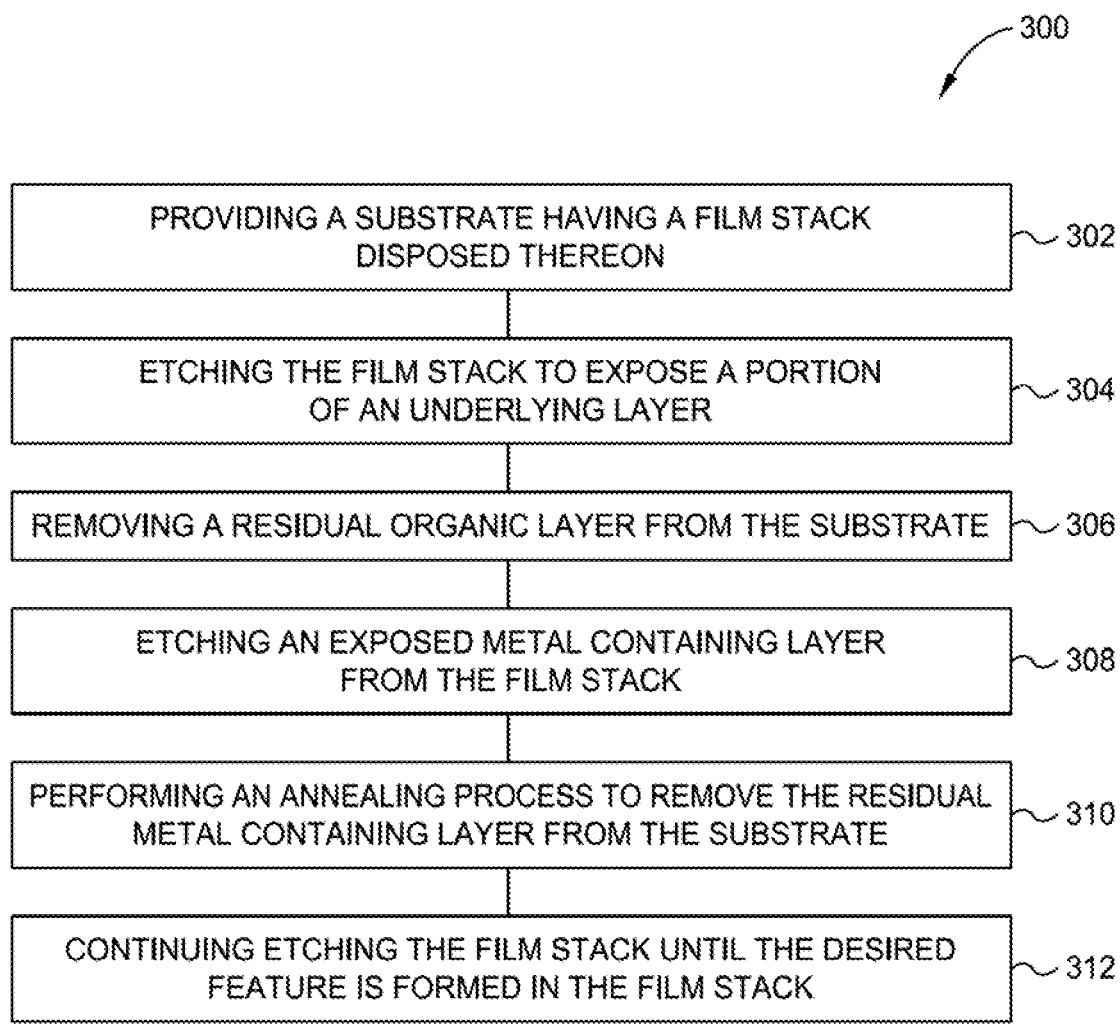
FIG. 3 is a flowchart of a method for patterning a material layer on a substrate, according to one or more embodiments of the present disclosure.

FIG. 3 is a flow diagram of one example of a method 300 for an etching process for etching a material layer (or called a conductive layer) in a film stack utilized to form a structure on a substrate. The material layer may have different film properties from the nearby materials disposed in the film stack. FIGS. 4A-4B, 5A-5B, 6A-6B, 7A-7B, 8A-8B, 9A-9B and 10A-10B are prospective views and cross-sectional views of a portion of a substrate 400 with a film stack 450 formed thereon corresponding to various stages of the method 300. The figures ending with an "A" designation illustrate perspective views at various instances of processing. The figures ending with a "B" designation illustrate cross-sectional views at various instances of processing corresponding to cross-section AA'. In some figures, some reference numbers of components or features illustrated therein may be omitted to avoid obscuring other components or features; this is for ease of depicting the figures. The method 300 may be utilized to form a back-end structure, such as a dual damascene structure, for advanced semiconductor applications.

The method 300 begins at operation 302 by providing the substrate 400 having the film stack 450 formed thereon. The film stack 450 includes an interface layer 402 disposed between the substrate 400 and the film stack 450. In one embodiment, the interface layer 402 may be any suitable materials that can be able to bridge the film stack 450 and the substrate 400. In some examples, the interface layer 402 may include different structures formed thereon, such as front end structure, back end structure, contact structure, metal conductive structures, insulating structures or the like formed therein as needed. The interface layer 402 may be a conductive layer or a dielectric layer as needed. In some embodiment wherein the film stack 450 has a good interface adhesion to the substrate 400, the interface layer 402 may be eliminated.

Figure 4B:
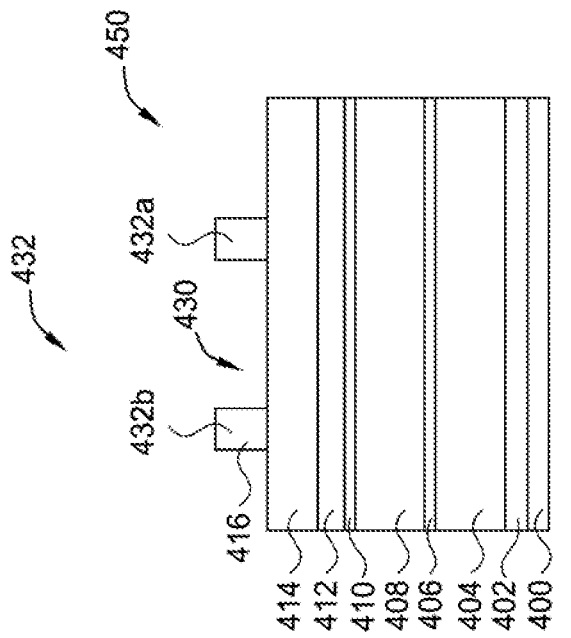
Figure 4A:
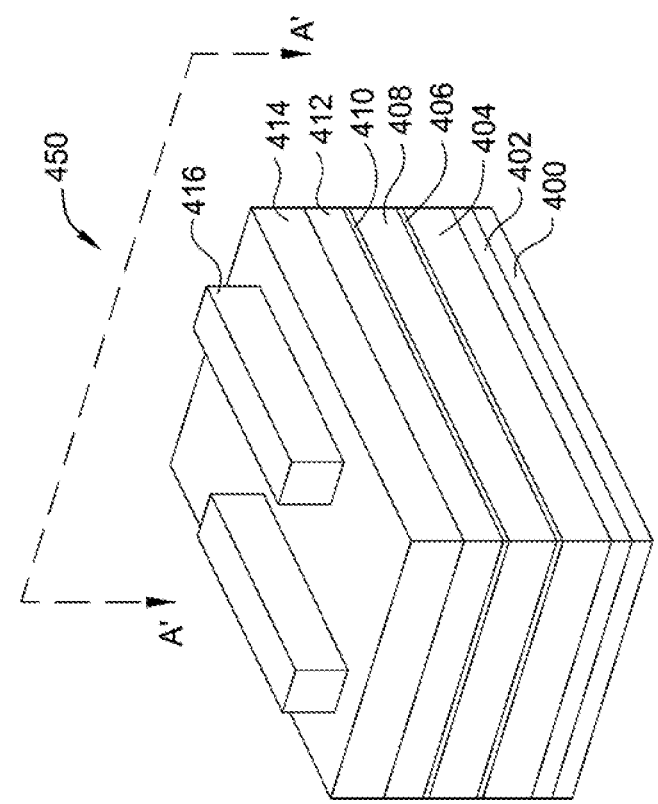

The film stack 450 includes a first conductive layer 404, a second conductive layer 406, a third conductive layer 408 and a fourth conductive layer 410. The first and the third conductive layers 404, 408 may be made by similar or the same material while the second and the fourth conductive layers 406, 410 may be made by similar or the same material. In other words, the third and fourth conductive layers 408, 410 are a repeating pair of the first and the second conductive layer 404, 406. Although only two pairs of the conductive layers are shown in FIG. 4A-4B, it is noted that the pairs of the conductive layers 404, 406 or 408, 410 may be formed in any number as needed. In one example, the first and the third conductive layers 404, 408 are Ru containing layers, Mo containing layer, NiSi containing layer and the like, and the second and the fourth conductive layers 406, 410 are Ti containing layer, Ta containing layer, TiN containing layer, TaN containing layer, TiON containing layer, TaON containing layer, TiO containing layer, TiN containing layer and the like. The conductive layers 404, 406, 408, 410 may be formed by a MOCVD process, PECVD, flowable CVD, PVD, ALD, or any suitable deposition techniques.

A dielectric layer 412 is then formed on the fourth conductive layer 410. The dielectric layer 412 may a silicon oxide, silicon nitride, silicon oxynitride (SiON), silicon oxycarbide (SiOC), or amorphous carbon materials as needed. A first sacrificial layer 414 along with a patterned photoresist layer 416 is then formed on the dielectric layer 412. The first sacrificial layer 414 may be an organic polymer material spin-on-coated onto the dielectric layer 412. The first sacrificial layer 414 may be an organic polymer material composed by hydrocarbon compounds. The monomer or polymer material may have a formula $C_xH_yO_z$, wherein x, y and z are integers.

The first sacrificial layer 414 may be spin-on-coated onto a non-planar substrate surface with a sufficient thickness to create a substantially planar top surface for the first sacrificial layer 414. In the embodiment depicted in FIGS. 4A-4B, the first sacrificial layer 414 is spin-on-coated onto a substantially planar surface of the dielectric layer 412 ready for patterning. Suitable examples of the first sacrificial layer 414 include photoresist material, spin-on-glass (SOG) materials, and the like. In one example, the photoresist material may be a positive tone photoresist, a negative tone photoresist, a UV lithography photoresist, an I-line photoresist, an G-line photoresist, an e-beam resist (for example, a chemically amplified resist (CAR)) or other suitable photoresist. It is believed that the organic polymer materials provided for the first sacrificial layer 414 may have a self-leveling planarization property so as to be coated onto the dielectric layer 412 to evenly cover the uneven topography, if any, of the structures formed on the substrate. By doing so, uneven topographic surface from the substrate 400 may be covered with a planarized or flattened top surface to facilitate the subsequent photolithographic process so as to transfer features into the film stack 450 on the substrate 400 with accurate and precise dimension control.

In one embodiment, the first sacrificial layer 414 may be spin-coated onto the substrate surface. In another embodiment, the first sacrificial layer 414 may also be coated onto the substrate using injection, spray deposition system, spray deposition system, aerosol deposition (AD) process, aerojet, nanoparticles spray from solution, spray CVD, ink-jet, meniscus coating, dip coating, electroplating, spray coating, electrospraying, screen printing, or by other suitable techniques as needed.

The patterned photoresist layer 416 includes an organic resist layer. The patterned photoresist layer 416 may be utilized for extreme ultraviolet (EUV) applications as needed.

At operation 304, a first etching process is performed to pattern the film stack 450 using the patterned photoresist layer 416 as an etching mask. The first etching process is performed to etch the film stack 450 until the second conductive layer 406 is exposed, as shown in FIGS. 5A and 5B, forming an opening area 430 in the film stack 450 between the patterned structures 432 (further shown as 432a, 432b) from the film stack 450. The etching process may be performed by transferring the substrate 400 into an etching processing chamber, such as the processing chamber 100 depicted in FIG. 1. The first etching process may have multiple different etching precursors supplied during different stage of the etching process so as to etch the first sacrificial layer 414, the dielectric layer 412, the fourth conductive layer 410 and the third conductive layer 408 in an efficient manner. In one example, the etching precursors utilized to etch the film stack 450 include halogen containing gases and the like. Suitable examples of the etching precursors include $CH_4$, $C_2H_6$, $C_4H_8$, $C_4F_6$, $C_4F_8$, $C_2F_2$, $CF_4$, $CHF_3$, $C_2F_6$, $C_4F_6$, $C_5F_8$, $CH_2F_2$, $SF_6$, $NF_3$, $Cl_2$, HBr, HCl, HF and the like. Other reacting gases, such as $O_2$, $O_2$, $H_2$, $N_2$, $H_2O$, $O_3$, $CO_2$, and the like, may also be supplied during the etching process as needed.

After a predetermined portion (e.g., the open area 430) of the film stack 450 is etched, a second sacrificial layer 422 is then formed on the film stack 450 as well as a second patterned photoresist layer 438, as shown in FIGS. 6A-6B. The second patterned photoresist layer 438 is formed above the patterned structures 432 and is vertically aligned with the two ends of the patterned structures 432 respectively. The second patterned photoresist layer 438 exposes a center portion 440 of the patterned structures 432 (which will be further illustrated in FIGS. 7A-7B and 8A-8B) to be patterned for the following etching process.

The second sacrificial layer 422 is similar to or the same as the first sacrificial layer 414. The second sacrificial layer 422 is formed on the non-planar substrate surface with a sufficient thickness to create a substantially planar top surface for the second sacrificial layer 422. As previously shown in FIGS. 5A-5B, after the etching process, the open area 430 is formed between the patterned structures 432 (further shown as 432a, 432b), thus creating an uneven surface. Thus, the second sacrificial layer 422 has a self-leveling capability so as to be coated onto the uneven surface of the etched film stack 450 to evenly cover the uneven topography. By doing so, uneven topographic surface from the open area 430 between the patterned structures 432 may be covered with a planarized or flattened top surface to facilitate the subsequent photolithographic process.

Figure 7B:
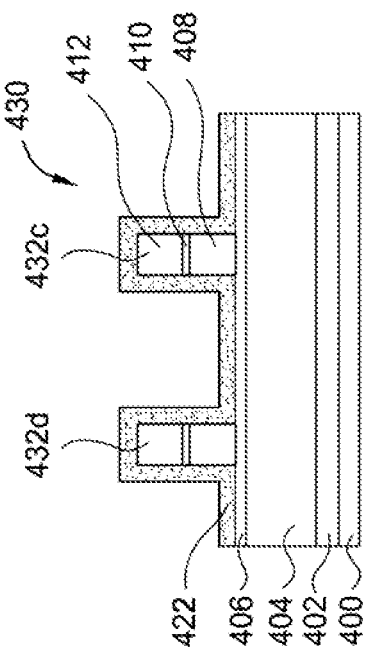
Figure 7A:
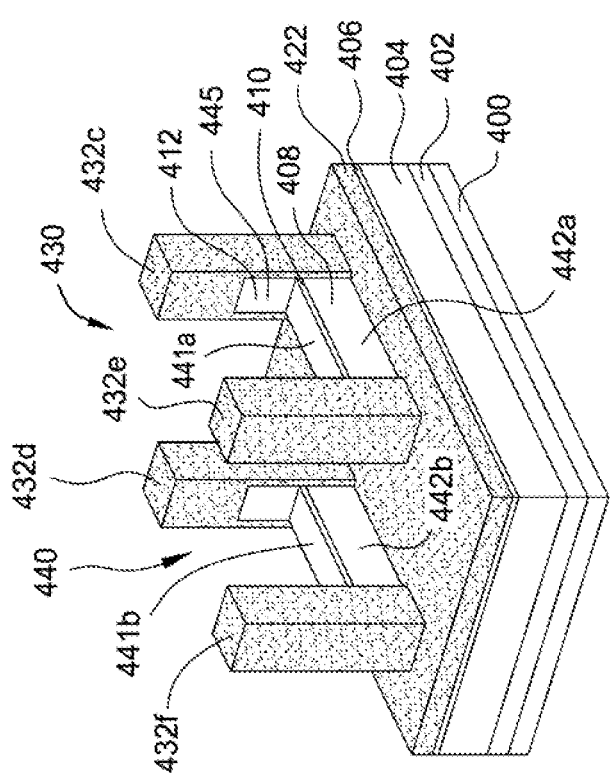

After the second sacrificial layer 422 is formed, a second etching process is performed to etch the film stack 450 through the open area 430 and the center portion 440 defined between the second patterned photoresist layer 438 formed on the substrate 400. The second etching process is continuously performed until a surface 441a, 441b of the fourth conductive layer 410 is exposed, as shown in FIGS. 7A-7B. It is noted that the surface 441a, 441b of the fourth conductive layer 410 aligns with the center portion 440 defined by the second patterned photoresist layer 438 so that after the second etching process, the surface 441a, 441b of the fourth conductive layer 410 exposed by the center portion 440 is then exposed. The patterned structures 432a, 432b is then further etched to include the surface 441a, 441b respectively from the center portion 440, forming the corner structures 432c, 432d, 432e, 432f connected by the surface 441a, 441b. In the structure depicted in FIGS. 7A-7B, a sidewall 445 of the dielectric layer 412 is exposed as well as the sidewalls 442a, 442b of the third and fourth conductive layer 408, 410 at the center portion 440 is exposed.

At operation 306, a residual removal process is performed to remove the remaining second sacrificial layer 422 from the substrate 400, exposing the second conductive layer 406 in the open area 430, as shown in FIGS. 8A-8B. The residual removal process is performed to remove the residual second sacrificial layer 422 from the substrate 400. The residual second sacrificial layer 422 on the fourth conductive layer 410 and the second conductive layer 406 in the center portion 440 and the open area 430 may adversely impact on the etching performance subsequently performed to remove the fourth conductive layer 410 and the second conductive layer 406. Thus, a residual removal process is performed prior to the second and fourth conductive layers 406, 410 are removed.

In one example, the residual removal process is a hydrogen treatment process. The residual removal process is performed by supplying a residual removal gas mixture comprising a hydrogen containing gas to the substrate 400 to remove residual second sacrificial layer 422 (as shown in FIGS. 7A-7B) from the substrate 400 until the center portion 440 and the open area 430 of the second and the fourth conductive layers 406, 410 are exposed, as shown in FIGS. 8A-8B. The residual removal gas mixture includes a hydrogen containing gas and optionally an inert gas. Suitable examples of the hydrogen containing gas include $H_2$, $H_2O$, $H_2O_2$, $NH_3$, and the like.

While performing the residual removal process, some of the exposed surfaces (such as the surface 441a, 441b of the center portion 440 of the fourth conductive layer 410, sidewalls 442a, 442b of the third conductive layer 408 and the sidewalls 445 of the dielectric layer 412 as shown in FIGS. 7A-7B) with different materials are also exposed under the reactive species from the residual removal gas mixture. Thus, the reactive species for performing the residual removal process are selected to have high selectivity among these materials, so that the reactive species can selectively remove the residual second sacrificial layer 422 without substantially attaching attacking the exposed fourth conductive layer 410, third conductive layer 408 and the dielectric layer 412. In one embodiment, a hydrogen containing gas supplied from a remote plasma source is provided to selectively remove the residual second sacrificial layer 422. Nitrogen containing gas, such as $N_2$, $N_2O$, $NO_2$, $NH_3$, may also be optionally supplied in the residual removal gas mixture. In one particular example, the residual removal gas mixture includes $H_2$ and $N_2$.

During the residual removal process, several process parameters may also be regulated. In one exemplary embodiment, a process pressure in the processing chamber 100 is regulated between about 10 mTorr and about 5000 mTorr, such as between about 10 mTorr and about 200 mTorr. A remote plasma source and/or an optional RF bias power may be utilized the residual removal process. The power supplied to the remote plasma source may be between 1000 Watts and about 20,000 Watts, such as about 5000 Watts. In one example, the RF bias power is not applied while supplying the residual removal gas mixture. The elimination of the RF bias power while performing the residual removal process can assist the reactive species in the plasma generated from the residual removal gas mixture to be more uniformly distributed across the substrate surface with relatively gentle power without specific directionality.

The hydrogen containing gas from the residual removal gas mixture may be flowed into the chamber at a rate by volume between about 500 sccm to about 2000 sccm and the nitrogen containing gas may be supplied at a rate by volume between about 500 sccm to about 2000 sccm. The hydrocarbon containing gas and the nitrogen containing gas from the residual removal gas mixture may be supplied simultaneously to the processing chamber or alternatively or sequentially supplied as needed.

A substrate temperature is maintained at greater than 100 degrees Celsius, such as between about 120 degrees Celsius to about 400 degrees Celsius, such as between about 150 degrees Celsius and about 350 degrees Celsius, for example between about 200 degrees Celsius and about 300 degrees Celsius. It is believed that the high temperature control of the substrate 400 during the residual removal process may assist and evaporate the polymer materials from the residual second sacrificial layer 422, so as to enhance the removal efficiency without damaging other materials on the substrate 400.

Figure 9A:
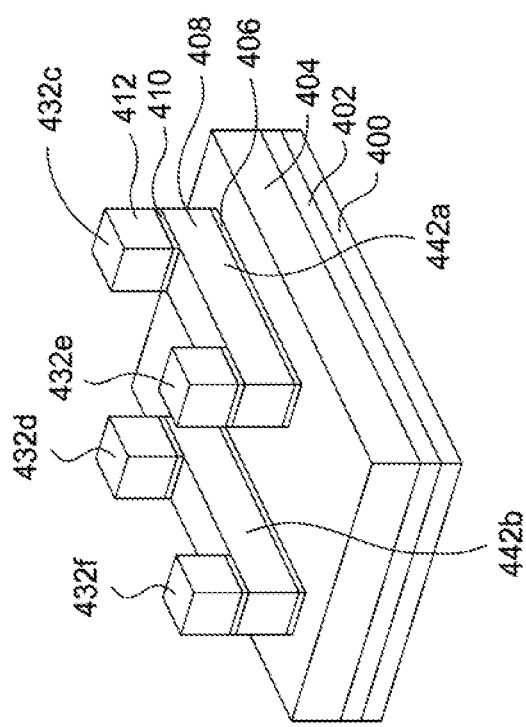
Figure 9B:
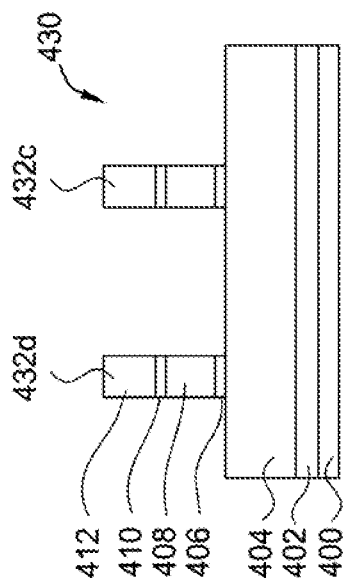

At operation 308, a main etching process is performed to etch the exposed fourth and second conductive layers 410, 406 simultaneously, until the underlying third and first conductive layers 408, 404 are exposed, as shown in FIGS. 9A-9B. The main etching process is performed by supplying a main etching gas mixture to the processing chamber, such as the processing chamber 100 depicted in FIG. 1, to etch the exposed fourth and second conductive layers 410, 406.

The main etching process further includes three steps comprising a break-through process, a bulk etching process, and a residual clean process. The main etching process as performed is highly selective so that the reactive species from the main etching process can predominately etch the fourth and second conductive layers 410, 406 without substantially attacking the dielectric layer 412 as well as the underlying third and first conductive layers 408, 404 when exposed. In the example wherein the fourth and second conductive layers 410, 406 are titanium (Ti) containing material, the reactive species from the main etching gas mixture may predominately react with the titanium (Ti) containing material without substantially reacting with the oxide material from the dielectric layer 412, thus providing a selective etching process. The selective etching process can preferentially etch a target material (such as the titanium (Ti) containing material in this example) without attacking or damaging the nearby material (such as an oxide containing material from the dielectric layer 412 in this example).

In one example, the main etching gas mixture includes a halogen containing gas, such as a chlorine containing gas. An inert gas may also be supplied in the main etching gas mixture. Suitable examples of the chlorine containing gas include $Cl_2$, HCl and the like. It is believed that the chlorine containing gas can predominately react with the Ti or Ta elements from the fourth and second conductive layers 410, 406 so as to remain minimum oxide damage or oxide loss from the dielectric layer 412. In one example, the main etching gas mixture includes a chlorine containing gas, such as $Cl_2$ gas, and a Ar gas.

In one example, the ratio of the $Cl_2$ gas and the Ar gas supplied in the main etching gas mixture may be varied, adjusted, altered or changed while etching the titanium (Ti) containing material. As the upper surface of the titanium (Ti) containing material often includes $TiO_x$, a relatively high ratio of the $Cl_2$ gas in the main etching gas mixture (e.g., higher chlorine gas flow rate) is utilized to break through the surface oxide, if any, from the surface of the titanium (Ti) containing material from the fourth and second conductive layers 410, 406. In one example, the thickness of the upper $TiO_x$ may be about 3% to about 20% from the total thickness of the fourth and second conductive layers 410, 406. In one example, the $Cl_2$ gas supplied in the main etching gas mixture has a high ratio to the Ar gas supplied in the main etching gas mixture during the breaking-through process. In one example, the $Cl_2$ gas and the Ar gas supplied in the main etching gas mixture is controlled at a ratio ($Cl_2$ gas:Ar gas) greater than 10:1, such as between about 10:1 and about 50:1. The $Cl_2$ gas in the main gas mixture is supplied at a first flow rate.

After the titanium (Ti) containing material is broken through, a relatively similar amount of the $Cl_2$ gas and the Ar gas (e.g., lower chlorine gas flow rate or flow ratio) is then used in the main etching gas mixture to etch the bulk body of the titanium (Ti) containing material from the fourth and second conductive layers 410, 406 (e.g., or called a bulk etching process). In the bulk titanium (Ti) containing material etching process, the $Cl_2$ gas and the Ar gas supplied in the main etching gas mixture is controlled at a ratio ($Cl_2$ gas:Ar gas) between about 1:4 and about 2:1. In this example, the thickness of the fourth and second conductive layers 410, 406 may be etched about 5% to about 98%, such as between about 50% and about 98%, from the total thickness of the fourth and second conductive layers 410, 406. The $Cl_2$ gas in the main gas mixture is supplied at a second flow rate at the bulk etching process lower than the first flow rate.

Lastly, a relatively high ratio of the $Cl_2$ gas to the Ar gas (similar to the breaking-through process) is used to remove the residual titanium (Ti) containing material (e.g., or called a residual clean process) from the fourth and second conductive layers 410, 406 and the oxide residuals from the dielectric layer 412, if any. The $Cl_2$ gas in the main gas mixture in the residual clean process is at a third flow rate less than the second flow rate but similar to or the same as the first flow rate. In one example, the $Cl_2$ gas and the Ar gas supplied in the residual clean process in the main etching gas mixture is controlled at a ratio ($Cl_2$ gas:Ar gas) between about greater than 10:1, such as between about 10:1 and about 20:1. It is noted that the ratio of the $Cl_2$ gas to the Ar gas in the main etching gas mixture for the residual clean process and the break-through process may be similar or the same.

It is noted that the main etching gas mixture supplied for etching the fourth and second conductive layers 410, 406 may be gradually adjusted, altered or varied to meet the different process requirements during the break-through process, bulk etching process, and the residual clean process During the main etching process (including the break-through process, bulk etching process, and the residual clean process), several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while performing the flash etching process. The RF source and the RF bias power may be applied to the processing chamber in continuous mode or in pulsed mode. In one example, the RF bias power is applied while supplying the main etching gas mixture.

The RF bias power applied when supplying the main etching gas mixture assists forming the reactive exposed surfaces 440a, 440b, 430 of the fourth and second conductive layers 410, 406 for etching. In one example, the RF source power at a frequency of about 13 MHz may be applied to maintain a plasma in the deposition gas mixture. For example, a RF source power of about 100 Watts to about 1000 Watts may be applied to maintain a plasma inside the processing chamber 100. A RF bias power of about 300 Watts to about 700 Watts may be applied while supplying the main etching gas mixture.

A substrate temperature is maintained between about 10 degrees Celsius to about 300 degrees Celsius, such as between about 20 degrees Celsius and about 80 degrees Celsius, for example between about 30 degrees Celsius and about 50 degrees Celsius.

At operation 310, a post annealing process is performed. The post annealing process is a high pressure annealing process performed at high process pressure, such as greater than 2 bar but less than 70 bar. The high pressure annealing process may assist repairing the vacancies and etching byproduct and/or residuals and smoothening surface roughness that might resulted from the main etching process in the exposed third and first conductive layers 408, 404 and the dielectric layer 412 after the main etching process. In some examples, the high process pressure may go up to 70 bar. The high pressure annealing process may be performed at a processing chamber, such as the processing chamber 200 depicted in FIG. 2, or other suitable processing chambers, including those that process substrate one at a time.

The high pressure annealing process performed at operation 310 maintains processing pressure at the high-pressure region in a vapor phase, for example in a dry vapor phase that has substantially no liquid droplets present. The processing pressure and temperature is controlled to density the film structures, so as to repair the film defects, driving out impurities smoothing surface roughness. In one example, the internal volume 215 (as shown in FIG. 2) is pressurized to a pressure greater than atmosphere, for example greater than about 2 bar. In another example, the internal volume 215 is pressurized to a pressure from about 5 to about 70 bars, such as from about 5 to about 50 bars, such as between about 25 bar and about 55 bar. As the high pressure may efficiently assist densifying the film structure, a relatively low processing temperature, such as less than 500 degrees Celsius, to reduce likelihood of thermal cycle damage to the substrate 400.

During processing, the internal volume 215 is maintained at a relatively low temperature, for example, a temperature less than 500 degrees Celsius, such as between about 150 degrees Celsius and about 350 degrees Celsius, by the heaters 240. Thus, a low thermal budget to the substrate may be obtained by utilizing the high pressure annealing process along with low temperature regime.

It is believed that the high pressure process may provide a driving force to drive out the dangling bonds in the exposed third and first conductive layers 408, 404 and the dielectric layer 412, thus, repairing the residuals and smoothening the surface roughness in the exposed third and first conductive layers 408, 404 and the dielectric layer 412 during the annealing process. In one example, a hydrogen or nitrogen containing gas, such as $H_2$, $H_2O$, $H_2O_2$, $N_2O$, $NO_2$, $NH_3$, and dry steam, may be supplied during the annealing process. An inert gas, such as He and Ar, may also be supplied during the annealing process.

In one exemplary implementation, a process pressure is regulated at a pressure greater than 2 bar, such as between 5 bar and 70 bar, such as between 20 bar and about 50 bar. The process temperature may be controlled at greater than 150 degrees Celsius but less than 500 degrees Celsius, such as between about 150 degrees Celsius and about 380 degrees Celsius, such as between about 180 degrees Celsius and about 400 degrees Celsius.

After the annealing process at high pressure, the third and first conductive layers 408, 404 and the dielectric layer 412 has a repaired film structure with high purity, large grain structure with smooth surface roughness, which provides a relatively robust film structure that provides higher film density and low film resistivity is obtained. In the example wherein the third and first conductive layers 408, 404 are Ru containing material, the film resistivity for the Ru containing material from the third and first conductive layers 408, 404 may be reduced between about 3% and about 7% after the high pressure annealing process.

Figure 10B:
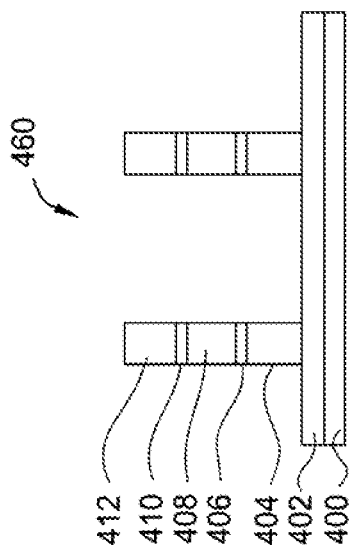
Figure 10A:
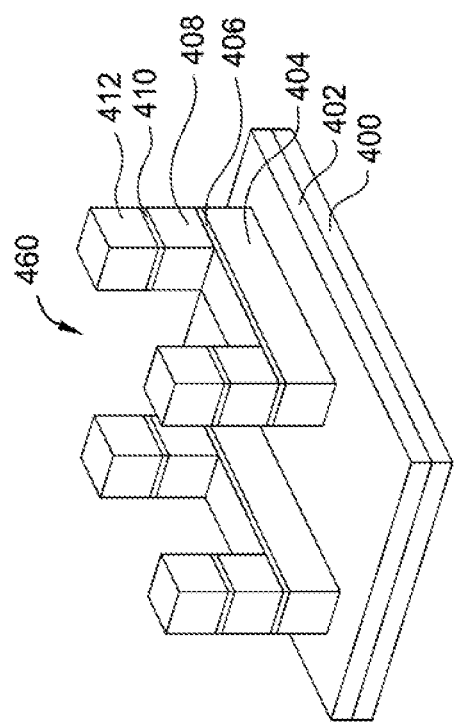

At operation 312, after the third and first conductive layers 408, 404 is exposed, further etching process may be performed to remove the third and first conductive layers 408, 404, as shown in FIGS. 9A-9B and followed with additional etching process, until a desired structure 460 is formed on the substrate 400, as shown in FIGS. 10A-10B. The structure 460 as formed on the substrate 400 may be a dual subtractive structure utilized in a back-end structure for semiconductor applications. It is also noted that the structure 460 may also be utilized to form any suitable structures on the substrate 400 as needed.

Thus, methods for etching features in a film stack are provided. The methods utilize a three step process comprising a residual removal process, a main etching process and a high pressure annealing process to etch the metal containing material in the film stack. Furthermore, the main etching process further comprises a three step process comprising a breaking-through process, a bulk etching process, and a residual clean process. The process can efficiently etch a target material, such as a conductive layer, in the film stack without substantially attacking other materials in the film stack.

While the foregoing is directed to embodiments of the present disclosure, other and further embodiments of the disclosure may be devised without departing from the basic scope thereof, and the scope thereof is determined by the claims that follow.

We claim:

1. A method for patterning a conductive layer on a substrate, comprising:
    supplying a gas mixture comprising a chlorine containing gas at a first flow rate to etch a first conductive layer disposed on the substrate;
    lowering the chlorine containing gas in the first gas mixture to a second flow rate lower than the first flow rate to continue etching the first conductive layer; and
    increasing the chlorine containing gas in the first gas mixture to a third flow rate greater than the second flow rate to remove the first conductive layer from the substrate.

2. The method of claim 1, wherein the first conductive layer is a Ti or Ta containing layer.

3. The method of claim 1, wherein the first gas mixture further comprises an inert gas.

4. The method of claim 1, wherein the chlorine containing gas is $Cl_2$ or HCl.

5. The method of claim 1, wherein the first flow rate is the same or similar to the third flow rate.

6. The method of claim 1, further comprising:
    performing a hydrogen treatment process prior to etch the first conductive layer.

7. The method of claim 6, further comprising:
    maintaining a substrate temperature at greater than 150 degrees Celsius while performing the hydrogen treatment process.

8. The method of claim 7, wherein the substrate temperature between about 200 degrees Celsius and about 300 degrees Celsius.

9. The method of claim 1, further comprising:
    performing a post annealing process to the substrate after the first conductive layer is removed from the substrate.

10. The method of claim 9, wherein the post annealing process further comprises:
    maintaining a process pressure between about 5 bar and 100 bar.

11. The method of claim 10, further comprising:
    supplying an annealing gas mixture including a hydrogen containing gas or a nitrogen containing gas while performing the post annealing process.

12. The method of claim 9, wherein the post annealing process densifies a second conductive layer exposed on the substrate.

13. The method of claim 12, wherein the second material containing layer is a Ru containing material.

14. The method of claim 1, wherein the gas mixture supplied at the first flow rate removes an oxide material from the metal containing material.

15. The method of claim 1, wherein the gas mixture supplied at the second flow rate removes between about 5% and about 95% of the first conductive layer.

16. A method for patterning a conductive layer on a substrate, comprising:
    performing a hydrogen treatment process on a substrate to remove residuals on the substrate wherein the treatment process is performed at temperatures exceeding 100 degrees Celsius to remove residual material from a first conductive layer;
    performing an etching process by supplying an etching gas mixture comprising chlorine containing gas to etch a first conductive layer on the substrate until a second conductive layer is exposed on the substrate; and
    performing a post annealing process at a process pressure between about 5 bar and 100 bar.

17. The method of claim 16, wherein performing the etching process further comprising:
    maintaining the chlorine containing gas in the etching gas mixture from a first flow rate to a second flow rate and further to a third flow rate while etching the first conductive layer.

18. The method of claim 17, wherein the first flow rate is greater than the second flow rate.

19. The method of claim 16, wherein the first conductive layer is a Ta or Ti containing layer and the second conductive layer is a Ru containing layer.

20. A method for patterning a conductive layer on a substrate, comprising:
    removing residuals from on a substrate by a hydrogen treatment process, wherein the residuals comprises organic material, wherein the substrate comprises having a first conductive layer disposed on a second conductive layer,
    etching the first conductive layer by supplying an etching gas mixture comprising chlorine containing gas until a second conductive layer is exposed on the substrate, wherein the chlorine containing gas in the etching gas mixture is maintained from a first flow rate to a second flow rate and further to a third flow rate while etching the first conductive layer; and performing a post annealing process at a process pressure between about 5 bar and 100 bar to thermally treat the second conductive layer on the substrate.

\* \* \* \* \*